(12) United States Patent
Mathew et al.

(10) Patent No.: US 8,076,215 B2
(45) Date of Patent: Dec. 13, 2011

(54) METHOD OF FORMING AN ELECTRONIC DEVICE USING A SEPARATION TECHNIQUE

(75) Inventors: Leo Mathew, Austin, TX (US); Dharmesh Jawarani, Round Rock, TX (US)

(73) Assignee: AstroWatt, Inc., Round Rock, TX (US)

( * ) Notice: Subject to any disclaimer, the term of this patent is extended or adjusted under 35 U.S.C. 154(b) by 174 days.

(21) Appl. No.: 12/467,035

(22) Filed: May 15, 2009

(65) Prior Publication Data
US 2009/0286393 A1    Nov. 19, 2009

Related U.S. Application Data

(60) Provisional application No. 61/054,139, filed on May 17, 2008.

(51) Int. Cl.
*H01L 21/3205* (2006.01)
(52) U.S. Cl. .......................................... 438/458; 438/655
(58) Field of Classification Search .................. 438/458, 438/655
See application file for complete search history.

(56) References Cited

U.S. PATENT DOCUMENTS

| | | | |
|---|---|---|---|
| 5,494,835 A * | 2/1996 | Bruel | 156/250 |
| 5,527,766 A | 6/1996 | Eddy | |
| 5,854,123 A | 12/1998 | Sato et al. | |
| 6,174,425 B1 | 1/2001 | Simpson et al. | |
| 6,316,333 B1 * | 11/2001 | Bruel et al. | 438/458 |
| 6,727,549 B1 * | 4/2004 | Doyle | 257/347 |
| 6,794,276 B2 | 9/2004 | Letertre et al. | |
| 6,809,009 B2 | 10/2004 | Aspar et al. | |
| 6,881,644 B2 | 4/2005 | Malik et al. | |
| 7,180,093 B2 | 2/2007 | Takayama et al. | |
| 7,183,179 B2 | 2/2007 | Droes et al. | |
| 7,273,788 B2 | 9/2007 | Forbes | |
| 7,348,076 B2 | 3/2008 | Locher et al. | |
| 7,749,884 B2 | 7/2010 | Mathew et al. | |
| 2002/0055225 A1 * | 5/2002 | Gonzalez et al. | 438/253 |
| 2004/0235268 A1 | 11/2004 | Letertre et al. | |
| 2005/0061230 A1 | 3/2005 | Kokta et al. | |
| 2005/0269617 A1 * | 12/2005 | Hofmann et al. | 257/309 |
| 2006/0068565 A1 * | 3/2006 | Droes et al. | 438/458 |
| 2006/0076559 A1 | 4/2006 | Faure et al. | |
| 2006/0240275 A1 | 10/2006 | Gadkaree | |
| 2007/0071900 A1 | 3/2007 | Soussan et al. | |
| 2007/0249140 A1 | 10/2007 | Dross et al. | |
| 2007/0269960 A1 | 11/2007 | Letertre et al. | |
| 2008/0063840 A1 | 3/2008 | Morita et al. | |
| 2009/0096003 A1 * | 4/2009 | Zhu | 257/309 |

(Continued)

FOREIGN PATENT DOCUMENTS

JP    2006-332681 A    12/2006

(Continued)

OTHER PUBLICATIONS

International Search Report and Written Opinion dated Dec. 18, 2009 for PCT/US2009/043019.
International Search Report and Written Opinion dated Dec. 30, 2009 for PCT/US2009/044203.

(Continued)

*Primary Examiner* — N Drew Richards
*Assistant Examiner* — Robert Carpenter

(57) ABSTRACT

A method of forming an electronic device can include forming a patterned layer adjacent to a side of a substrate including a semiconductor material. The method can also include separating a semiconductor layer and the patterned layer from the substrate, wherein the semiconductor layer is a portion of the substrate.

16 Claims, 7 Drawing Sheets

U.S. PATENT DOCUMENTS

2010/0227475 A1    9/2010  Mathew et al.

FOREIGN PATENT DOCUMENTS

WO    2005/117123 A1    12/2005

OTHER PUBLICATIONS

Tong, Q.Y. et al. "A 'smarter-cut' approach to low temperature silicon layer transfer"; Appl. Phys. Lett. 72 (1), Jan. 5, 1998, American Institute of Physics, 1998, pp. 49-51.

Wolf, Stanley "2.10 Silicon-on-Insulator (SOI) Isolation Technologies", Silicon Processing for the VLSI Era, vol. 2; Process Integration, Lattice Press, California, 1990, 66-78 pages.

Llona, L.D. Vargas et al. "Seedless Electroplating on Patterned Silicon", J. Micromech, Microeng. 16, Journal of Micromechanics and Microengineering, IOP Publishing Ltd., May 8, 2006, pp. S1-S6.

U.S. Appl. No. 12/435,942, filed May 5, 2009.

U.S. Appl. No. 12/435,947, filed May 5, 2009.

Non-Final Office Action dated Oct. 5, 2009 from U.S. Appl. No. 12/435,942, filed May 5, 2009.

Notice of Allowance dated Mar. 25, 2010 from U.S. Appl. No. 12/435,942, filed May 5, 2009.

Non-Final Office Action dated Apr. 4, 2011 from U.S. Appl. No. 12/784,984, filed May 21, 2010.

* cited by examiner

METHOD OF FORMING AN ELECTRONIC DEVICE USING A SEPARATION TECHNIQUE

RELATED APPLICATION

This is related to and claims priority under 35 U.S.C. §119(e) to U.S. patent application Ser. No. 61/054,139 entitled "Method of Forming Contacts on a Semiconductor Layer and Related Devices" by Mathew et al. on May 17, 2008, which is assigned to the current assignee hereof and incorporated herein by reference in its entirety.

FIELD OF THE DISCLOSURE

The present invention relates generally to semiconductors, and in particular to methods for making semiconductor devices on a layer that has been separated from a substrate.

RELATED ART

The use of semiconductor layers that have been transferred onto substrates or substrates that have been thickened using various growth processes have been used in technologies such as silicon-on-insulator (SOI) technology. The transfer of layers therein involves process incorporation of a cleaving plane, sticking to a foreign substrate and separation of the surface layer. The incorporation of a cleaving plane is performed using a process of ion implantation or formation of porous layers. The bonding to a foreign substrate involves Van der Waals forces on extremely smooth surfaces; eutectic bonding using suitable materials; or thermo-compression bonding using suitable materials, elevated temperature, and elevated pressure. The separation involves annealing of the bubbles and cracks formed during ion implantation. In the formation of devices, the cycle time and cost of processes such as ion implantation and the formation of smooth surfaces is expensive.

In the formation of an electronic device, junctions can be used for applications, such as photovoltaic cells and light emitting diodes. Typically, the junctions are contacted on opposite sides of the substrate. In different applications, a plurality of contacts may lie along one side of the device.

BRIEF DESCRIPTION OF THE DRAWINGS

Embodiments are illustrated by way of example and are not limited in the accompanying figures.

Figure 1:
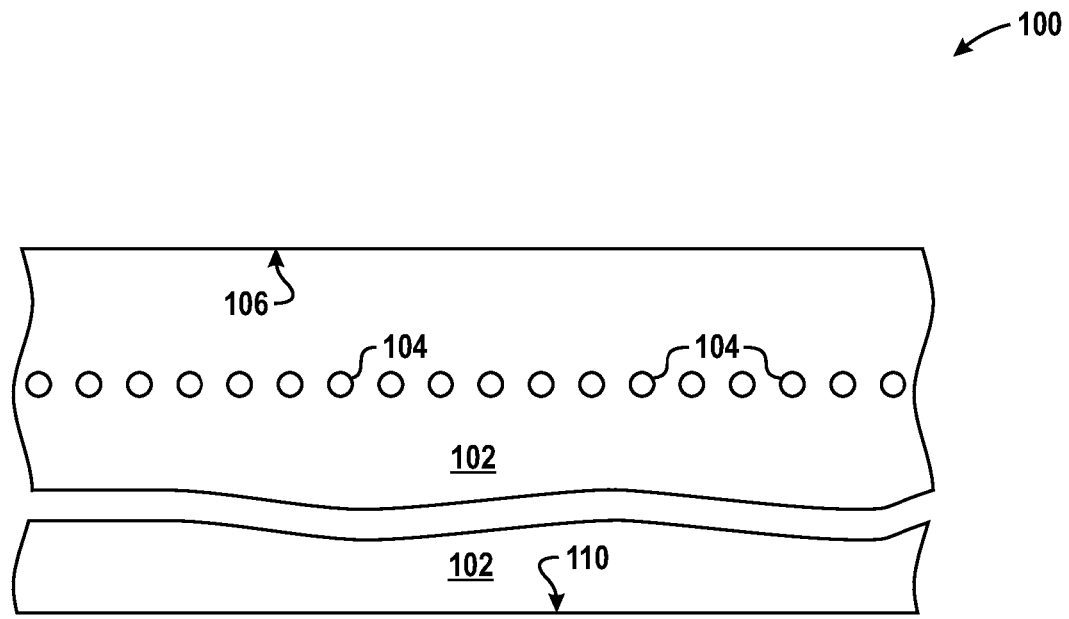
FIG. 1 includes an illustration of a cross-sectional view of a portion of a workpiece after forming a separation-enhancing species within a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Before addressing details of embodiments described below, some terms are defined or clarified. The term "metal" and any of its variants are intended to refer to a material that includes an element that is (1) within any of Groups 1 to 12, or (2) within Groups 13 to 15, an element that is along and below a line defined by atomic numbers 13 (Al), 50 (Sn), and 83 (Bi), or any combination thereof. Metal does not include silicon or germanium. Note, however, that a metal silicide is a metallic material.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A method of forming an electronic device can include forming a patterned layer adjacent to a side of a substrate including a semiconductor material. The method can also include separating a semiconductor layer and the patterned layer from the substrate, wherein the semiconductor layer is a portion of the substrate. In particular embodiments, the embodiments described herein can be used to forming contacts on one side of a substrate while using separation technique to be performed. In a particular embodiment, a separation-enhancing species to be introduced into a substrate to allow more readily the separation of a surface layer of semiconductor material to be removed from the substrate. A mechanical operation may not need to be performed for the separation, or if a mechanical operation is used, such mechanical operation would not need to be as aggressive or damaging as compared to a mechanical tearing operation performed in the absence of the separation-enhancing species. Further, the doped regions and contacts can be formed along a side opposite where light or other radiation would be received by an electronic device. Thus, the efficiency is improved as contacts, interconnects, and the like are not formed along the radiation receiving surface of the electronic device. Although the description below provides many details, including particular numerical values and configurations, after reading this specification, skilled artisans will appreciate that the embodiments described herein merely illustrate and do not limit the scope of the present invention.

FIG. 1 illustrates a workpiece 100 comprising a substrate 102 having a primary side 106 and an opposing side 110 along an opposite side of the substrate 102. The substrate may be a semiconductor substrate comprising a Group 14 element (silicon, germanium, or carbon), any combination of Group 14 elements (silicon germanium, carbon-doped silicon, or the like), or Group 13-Group 15 semiconductors (gallium arsenide, gallium nitride, indium phosphide, gallium indium arsenide, or the like). The substrate 102 can include a substantially monocrystalline, amorphous, or polycrystalline semiconductor substrate. In other embodiments, various combinations of materials may form the substrate. In a particular embodiment, the substrate can have a thickness of at least approximately 50 microns or at least approximately 200 microns. Although there is no theoretical upper limit on the thickness, the substrate may be no greater than approximately 5 meters or no greater than approximately 0.1 meter. In subsequent figures, the portion of the substrate 102 near the opposing side 110 is not illustrated for simplicity. As will be described in an alternative embodiment, ingot processing can be used to form substantially rectangular sheets.

A separation-enhancing species can be implanted to a depth 104 below the primary side 106 of the substrate 102, as illustrated in FIG. 1. The ion implantation can create defect sites, which during a subsequent separation operation, help in separating a portion of the substrate 102 including the primary side 106 from the remainder of the substrate 102 to form a semiconductor layer. The depth 104 may be based at least on part on the composition of substrate 102 and the particular electronic application, such as a photovoltaic cell, a light emitting device, a radiation detector, or the like. In a particular embodiment, the projected range is substantially equal to the desired thickness of the semiconductor layer that will be formed upon subsequent separation. In an embodiment, the projected range is at least approximately 1 micron or at least approximately 20 microns, and in another embodiment, the semiconductor layer can have a thickness no greater than approximately 100 microns or no greater than approximately 50 microns.

The separation-enhancing species can include hydrogen, helium, boron, silicon, fluorine, chlorine, or the like. Although not limited to those elements, the relatively lighter species may allow the species to be implanted relatively farther into the substrate 102 than if a relatively heavier species (e.g., germanium or arsenic) were used. Thus, the damage to the substrate 102, and particularly the semiconductor layer that will be subsequently separated from the substrate 102, may be less. After a particular species is selected, an implant energy is determined to achieve a desired projected range corresponding to the depth 104. The projected range can lie closer to the primary side 106 of the substrate 102 as compared to the opposing side 110. In a particular embodiment, the projected range is substantially equal to the desired thickness of the semiconductor layer that will be formed upon subsequent separation. The dose of the implant can be at least approximately $10^{15}$ ions/cm$^2$, approximately $10^{16}$ ions/cm$^2$, or even higher.

In another embodiment, the separation-enhancing species can be introduced later in the process flow or by using a different technique, such as an electrochemical process that is described later in this specification. In still another embodiment, a combination of the different techniques may be used.

FIG. 1 includes an illustration of both the primary side 106 and opposing side 110 of the substrate 102. For simplicity, FIGS. 2 to 8 do not include the opposing 110 of the substrate 102, although the opposing side 110 still remains part of the substrate 102.

Figure 2:
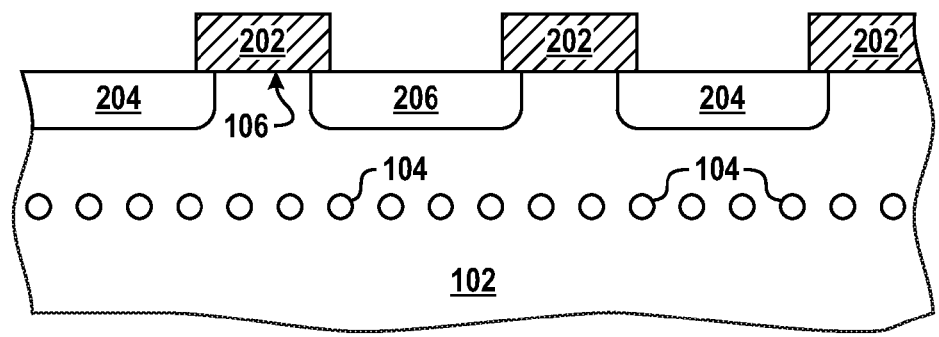
FIG. 2 includes an illustration of a cross-sectional view of the workpiece of FIG. 1 after forming a dielectric layer over and doped regions within the substrate.

A dielectric layer 202 is formed over the substrate 102, and doped regions 204 and 206 are formed within the substrate 102, as illustrated in FIG. 2. The dielectric layer 202 can be used to aid in the formation of subsequent contacts to the doped regions 204 and 206. The dielectric layer 202 can include an oxide, a nitride, an oxynitride, or the like and can be formed by growing or depositing a single film or a plurality of films. In an embodiment, the dielectric layer 202 can have a thickness of at least approximately 1 nm or at least approximately 1000 nm, and in another embodiment, the dielectric layer 202 can have a thickness no greater than approximately 1000 microns or no greater than approximately 100 microns.

The width of the openings or pattern of the openings in the patterned dielectric layer may be designed to enable the separation-enhancing species to be incorporated into the substrate 102 at a particular depth in the regions directly below the openings and at a different depth into the substrate 102 at regions directly below remaining portions of the dielectric layer 202. The separation-enhancing species may form a contiguous region to enable a contiguous region of substrate 102 to be separated.

The dielectric layer 202 is patterned to form a patterned dielectric layer that defines openings to expose portions of the substrate 102 where the doped regions 204 and 206 are formed. The openings corresponding to the doped regions 204 and 206 may be formed at substantially the same time or at different times. In a particular embodiment, openings corresponding to the doped regions 204 are formed, and portions of the substrate 102 are doped to form the doped regions 204, and then another opening corresponding to the doped region 206 is formed, and a portion of the substrate 102 is doped to form the doped region 206. In another embodiment, more or fewer doped regions may be formed. The doped regions 204 may be of the same conductivity type or opposite conductivity types. In an embodiment, the doped regions 204 may be n-type doped, and the doped region 206 may be p-type doped. When the substrate 102 is p-type doped, the doped region 206 can be used as a body contact, and pn junctions are formed at the interfaces between the doped regions 204 and substrate 102. Conductivity types can be reversed in another embodiment.

The doped regions 204 and 206 can be formed by gas-phase furnace doping, a spin-on dopant, depositing or growing a doped layer (a doped glass, a doped semiconductor layer (amorphous, polycrystalline, substantially monocrystalline), or by implantation. The doped regions 204 and 206 are typically formed during separate doping sequences. An anneal or dopant drive may be performed if needed or desired. In an embodiment, the peak concentration of the doped regions 204 and 206 are at least approximately $10^{17}$, $10^{18}$, or $10^{19}$ atoms/cm$^3$. In an embodiment, the junction depths of the doped regions 204 and is at least approximately 0.01 microns or at least approximately 0.1 microns, and in another embodiment, the junction depths of the doped regions 204 and 206 are no greater than approximately 5 microns or no greater than approximately 1 micron. If the dopant source for the doped regions 204 or 206 includes a layer formed over the substrate 102, the layer may or may not be removed after the corresponding doped regions are formed. For example, a doped silicon layer may be formed over the substrate 102 and remain. In a particular embodiment, the doped regions 204 or 206 may principally lie within the doped silicon layer. As between the doped region 206 and the doped regions 204, they can have the same dopant concentration or different dopant concentrations, and the same junction depth or different junction depths, and can be formed with the same doping technique or different doping techniques.

Figure 3:
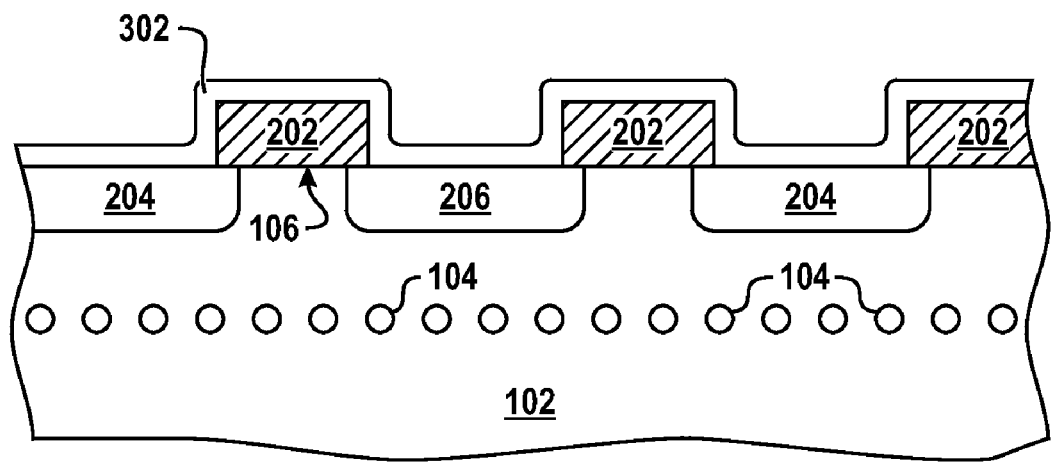
FIG. 3 includes an illustration of a cross-sectional view of the workpiece of FIG. 2 after forming a metal-containing layer.
Figure 4:
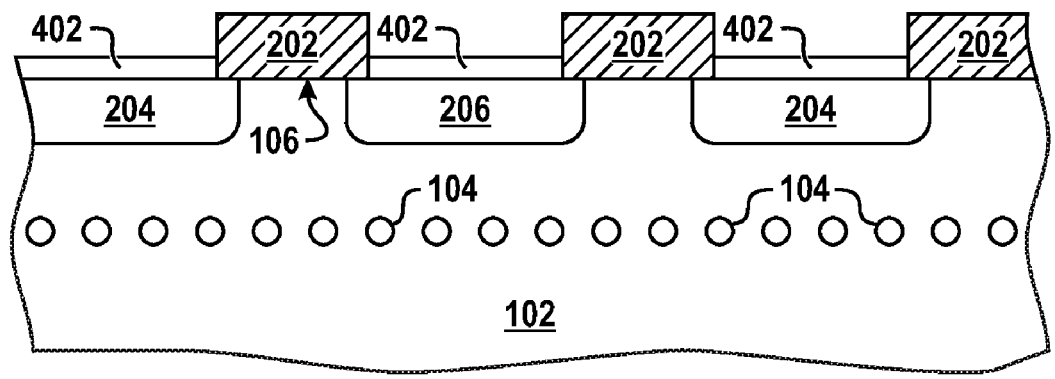
FIG. 4 includes an illustration of a cross-sectional view of the workpiece of FIG. 3 after forming metal-containing regions from the metal-containing layer.

A metal-containing layer 302 is formed over the dielectric layer 202 and the doped regions 204 and 206, as illustrated in FIG. 3. The metal-containing layer 302 can include an adhesion film, a barrier film, a seed film, another suitable film, or any combination thereof. The adhesion film can include a refractory metal (titanium, tantalum, tungsten, or the like), and the barrier film can include a metal nitride (TiN, TaN, WN of the like) or a metal semiconductor nitride (TaSiN, WSiN, or the like). The seed film can include a transition metal or transition metal alloy, and in a particular embodiment, the seed film can include titanium, nickel, palladium, tungsten, copper, silver, or gold. In other embodiments, other materials may be used within the adhesion film, barrier film, seed film, or any combination thereof. The metal-containing layer 302 can be formed by physical vapor deposition (PVD, such as evaporation or sputtering), chemical vapor deposition (CVD), atomic layer deposition (ALD), electrochemistry, another suitable method, or any combination thereof. In an embodiment, the metal-containing layer 302 can have a thickness of at least approximately 1 nm or at least approximately 10 nm, and in another embodiment, the metal-containing layer 302 can have a thickness no greater than approximately 10 microns or no greater than approximately 0.1 microns In a particular embodiment, the metal-containing layer 302 may be bonded to the doped regions 204 and 206 by reacting the metal-containing layer 302 with a semiconductor material within the doped regions 204 and 206 to form metal-containing regions 402, as illustrated in FIG. 4. The metal-containing layer 302 may include titanium, tantalum, tungsten, cobalt, nickel, platinum, or the like, and the metal-containing regions 402 can include a metal silicide compound. Unreacted portions, such as those overlying the dielectric layer 204 are removed.

In still another embodiment, a resist layer (not illustrated) may be formed over the metal-containing layer 302, and the resist layer can be etched until portions of the metal-containing layer 302 overlying the dielectric layer 202 are exposed. The portions of the metal-containing layer 302 overlying the dielectric layer 202 are etched, leaving metal-containing regions 402 within the openings of the dielectric layer 202. The remaining resist layer may then be removed. Another technique (e.g., polishing) can be used to form the metal-containing regions 402. In another embodiment (not illustrated), the metal-containing layer 302 in FIG. 3 is not patterned and remains over substantially of the workpiece, including over the dielectric layer 202 and within openings extending through the dielectric layer 202.

Figure 5:
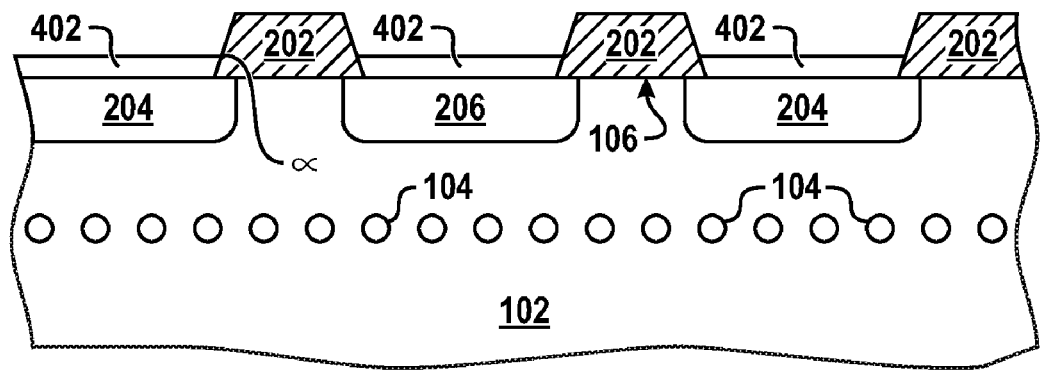
FIG. 5 includes an illustration of a cross-sectional view of the workpiece of FIG. 4 after parts of the dielectric layer have been reshaped.

The dielectric layer 202 can be reshaped, as illustrated in FIG. 5. The reshaping can be performed using a wet or dry etch process. For example, in an embodiment, the reshaping is performed using an HF dip or a plasma etch. In another embodiment, reshaping can be performed earlier in the process as described later in this specification. In a particular embodiment, an angle $\alpha$ as illustrated in FIG. 5 is defined by a side of the dielectric layer 202 and the primary side 106. The angle $\alpha$ can be an acute angle, and in an embodiment, the angle $\alpha$ is at least approximately 30° or at least approximately 45°, and in another embodiment, the angle $\alpha$ is no greater than approximately 75° or no greater than approximately 60°.

Figure 6:
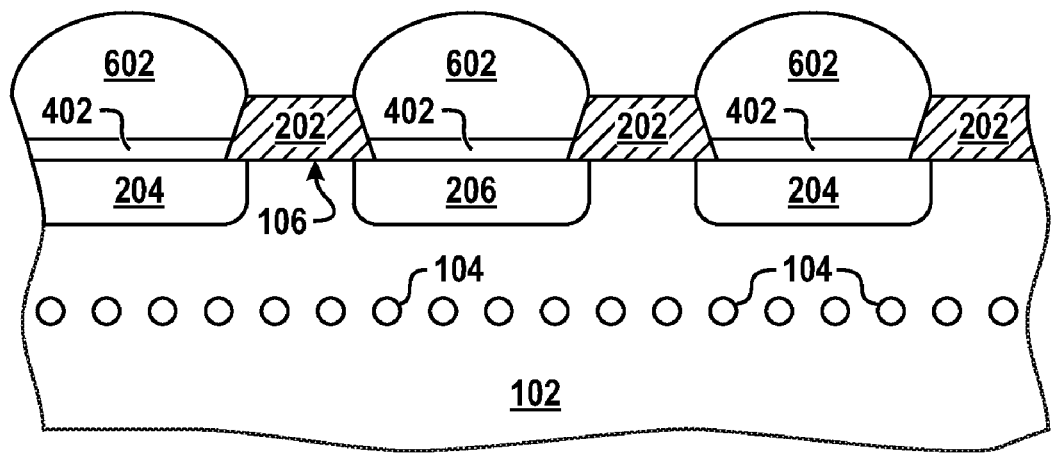
FIG. 6 includes an illustration of a cross-sectional view of the workpiece of FIG. 5 after forming metallic regions within openings of the dielectric layer.

Metallic regions 602 are formed as illustrated in FIG. 6. Different techniques can be performed to achieve the metallic regions 602. The metallic regions 602 may be substantially thicker and have a relatively higher conductance as compared to the metal-containing regions 402. In a particular embodiment, the metallic regions 602 are at least approximately 11 times, approximately 50 times, or approximately 500 times thicker than the metal-containing regions 402.

The metallic regions 602 can include any of the metals or metal alloys previously described with respect to the metal-containing regions 402. In a particular embodiment, the metallic regions 602 comprise tin, nickel, chromium, copper, silver, gold, or a combination thereof. Similar to the metal-containing regions 402, the metallic regions 602 can include a single film or a plurality of films. In a particular embodiment, the metallic regions 602 can consist essentially of gold, and in another embodiment, the metallic regions 602 can be mostly copper with a relatively thin indium-tin alloy to help improve soldering during a subsequent bonding operation. Other combinations of materials can be used such that the composition of the metallic regions 602 is tailored to a particular application. The metallic regions 602 can be formed by PVD, CVD, ALD, electrochemistry, another suitable method, or any combination thereof. The metallic regions 602 and the metal-containing regions 402 can include the same composition or different compositions and be formed using the same technique or different techniques. In an embodiment, metallic regions 602 can have a thickness of at least approximately 10 microns or at least approximately 30 microns, and in another embodiment, the metallic regions 602 can have a thickness no greater than approximately 2 mm or no greater than approximately 100 mm.

In a particular embodiment, the metallic regions 602 can be formed such that a separation-enhancing species is incorporated within the metallic regions 602 when it is formed. As previously described, the separation-enhancing species can help separate a portion of the substrate, in the form of a semiconductor layer, from a remaining portion of the substrate 102. In a particular embodiment, the separation-enhancing species is hydrogen. When the metallic regions 602 is formed using an electrochemical process, such as plating (i.e., electroplating or electroless plating), hydrogen may be incorporated from the metallic regions 602 from the plating bath, such as an acidic solution. When a PVD, CVD, or ALD process is used, hydrogen may come from a hydrogen-containing gas, such as an organometallic precursor, water vapor, a hydrogen-containing plasma, or any combination thereof. Hydrogen can be moved from the metallic regions 602 in the substrate 102 during a subsequent anneal.

In a particular embodiment, the metal-containing regions 402 form a template for the growth of the metallic regions 602. An electrochemical operation can be performed so that the metallic regions 602 are formed from the metal-containing regions 402; however, substantially none or only an insignificant amount of material is grown from the dielectric layer 202. In another embodiment, a metal paste including aluminum, nickel, silver, a suitable metal silicate, or any combination thereof can be pasted on the side of the workpiece closer to the primary side than the opposing side of the substrate 102. Polishing can be performed to remove portions of the metallic regions 602 that overlie the dielectric layer 202.

In another embodiment, the separation-enhancing species can be moved by an electrical field. For example, if the hydrogen is positively charged, then a sufficient strong negative charge from the substrate, a positive charge on the metallic regions 602, or both may be used to move the hydrogen from the metallic regions 602 into the substrate 102. An anneal and separation process as previously described can be performed.

Note that the separation-enhancing species can be introduced by an electrochemical process or by ion implantation as previously described. In a particular embodiment, a combination of ion implantation and an electrochemical process can be used to provide the separation-enhancing species. When both are used, a lower dose for the ion implantation of the separation-enhancing species may be used. For example, the combination may reduce the dose during implant by approximately one to two orders of magnitude.

Figure 7:
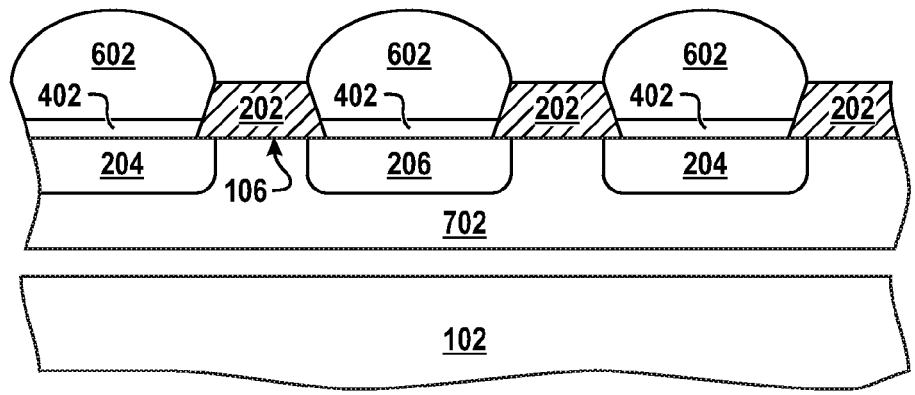
FIG. 7 includes an illustration of a cross-sectional view of the workpiece of FIG. 6 after separating a semiconductor layer from the substrate.

During heating or cooling after the anneal, stress can build within the substrate 102 and help to separate the combination of the metallic regions 602, the metal-containing regions 402, the dielectric layer 202, the doped regions 204 and 206, and a semiconductor layer 702, which is a portion of the substrate 102, from a remaining portion of the substrate 102, as illustrated in FIG. 7. Thus, the location of the separation-enhancing species 104 in FIG. 6 represents a weak point from which separation may occur due to strain and mismatch of coefficients of thermal expansion between the materials in the workpiece. The separation may occur during the heating or cooling or thereafter. For example, a mechanical operation may be used to help with the separation. In a particular embodiment, the separation may occur by cleaving or fracturing the substrate 102 at a location at or near where the separation is to be performed. A wedge, wire, saw, laser, an acoustical device, or any combination thereof may be used to aid in the mechanical separation. In another embodiment, a metallic paste can be mechanically applied over the workpiece, and a stiffened or handling substrate can be attached to the metallic paste and used to aid the separation operation. In a particular embodiment, the separation can be analogous to an exfoliation operation. As illustrated in FIG. 7, the semiconductor layer 702 remains bonded to the portion of the workpiece which includes the metallic regions 602. The combination of the semiconductor layer 720, the metallic regions 602, and the dielectric layer 202 are thick enough to be handled mechanically for further processing.

The substrate 102 can be re-used as a handle for another semiconductor device to be formed. In another embodiment, the substrate 102 is polished using chemical or mechanical methods or a combination of these before reusing the substrate 102 for a subsequent electronic device.

Figure 8:
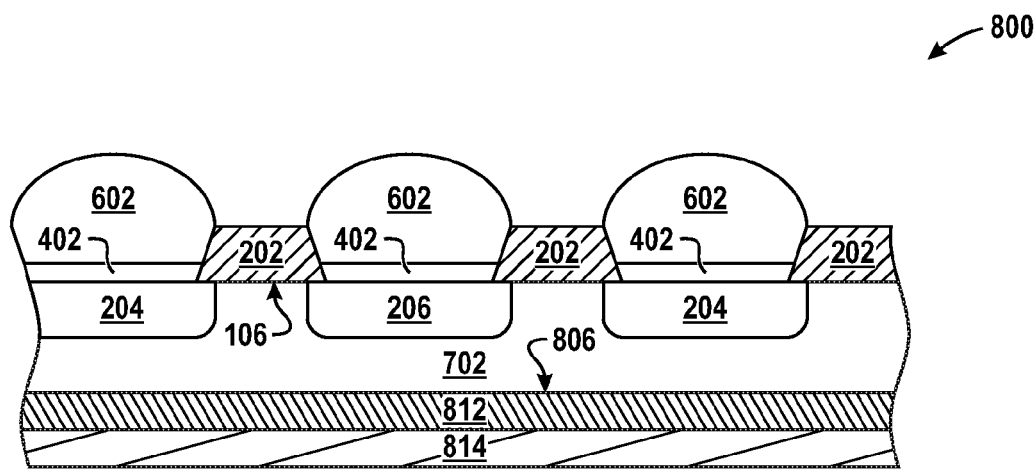
FIG. 8 includes an illustration of a cross-sectional view of the workpiece of FIG. 7 after the forming a substantially completed semiconductor device in accordance with an embodiment.

FIG. 8 illustrates a substantially completed semiconductor device 800. An anti-reflective coating 812, a passivation layer 814, another encapsulating layer, or any combination thereof can be formed along the opposite side 806 of the semiconductor layer 702. The layers 812 and 814 can be used when the application for the semiconductor device 800 is as a photovoltaic cell. Light or other radiation is received near the opposite side 806 and the contacts (e.g., the metallic regions 602) are formed near the primary side 106. By having the contacts along one side, rather than both sides, more area can be used for receiving radiation.

An electronic device can include the semiconductor device 800 or a plurality of semiconductor devices similar to or different from the semiconductor device 800. The electronic device can be a solar panel that includes one or more of the semiconductor devices, wherein the semiconductor devices are photovoltaic devices. In another embodiment, the electronic device can be a display that includes one or more of the semiconductor devices, wherein the semiconductor devices are light emitting devices. In still another embodiment, the electronic device can be a radiation detector that includes one or more of the semiconductor devices, wherein the semiconductor devices are radiation sensors. The electronic device can include different types of semiconductor devices. For example, an electronic device may include a display that includes control logic to adjust the intensity of the display based on the ambient light level within a room. In this particular electronic device, both light emitting devices and radiation sensors may be used. After reading this specification, skilled artisans will appreciate that many different configurations can be used to achieve a wide variety of applications.

Figure 9:
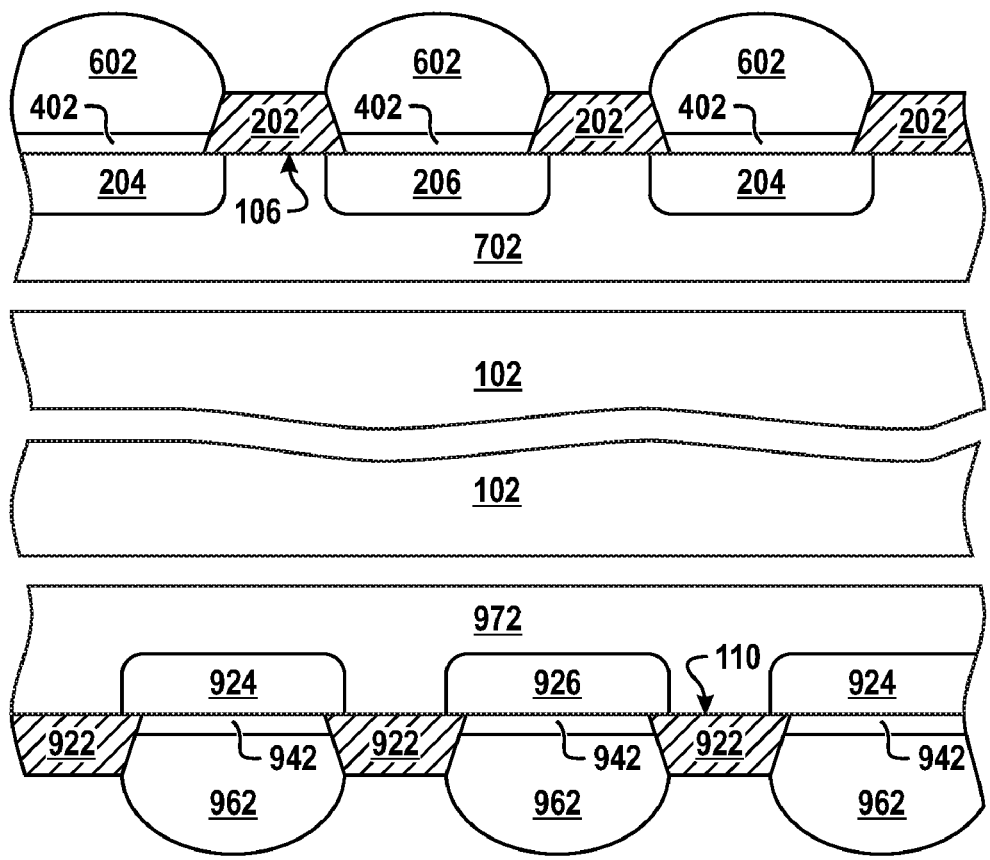
FIG. 9 includes an illustration of a cross-sectional view of an embodiment where semiconductor layers have been separated from opposite sides using any of procedures described with respect to FIG. 1 through FIG. 7.

FIG. 9 illustrates a workpiece in another embodiment, wherein the method of separation of the semiconductor layers occurs along opposite sides of the substrate 102. Any of the previously described processes can be used for the method. The embodiment as illustrated in FIG. 9 includes a particular, non-limiting embodiment. After reading this specification, skilled artisans will appreciate that other embodiments may be used without departing from the concepts described herein.

In the embodiment as illustrated in FIG. 9, the dielectric layers 202 and doped regions 204 and 206 are formed along the primary side 106 of the substrate 102, and a dielectric layer 922 and doped regions 924 and 926 are formed along the opposing side 110 of the substrate 102. The metal-containing regions 402 and 942 are formed within openings within the dielectric layer 202 and 922, respectively, and the metallic regions 602 and 962 are formed from the metal-containing regions 402 and 942, respectively. The separation enhancing species can be introduced at one or more points in the process flow. An anneal cycle allows the semiconductor layer 702 and 972 to be separated from the substrate 102.

The patterned dielectric layers 202 and 922 can be formed using any of the techniques as previously discussed with respect to the dielectric layer 202 in FIG. 2, and the doped regions 204, 206, 924, 926 can be formed using any of the techniques as previously discussed with respect to the doped regions 204 and 206 in FIG. 2. The metal-containing regions 402 and 942 can be formed using any of the techniques as previously discussed with respect to the metal-containing regions 402 in FIG. 4. Reshaping of the dielectric layer 202 and 922 are optional, and if performed, can be performed as previously described. The metallic regions 602 and 962 can be formed using any of the techniques as previously discussed with respect to the metallic regions 602 in FIG. 6. The separation-enhancing species (not illustrated) and separation techniques in forming the semiconductor layers 702 and 972 can be formed or performed using any of the techniques as previously discussed with respect to the separation-enhancing species (at different points in the process flow) and the semiconductor 702 in FIG. 7.

With respect to each set of features (i.e., with respect to the dielectric layers 202 and 922, etc.), such features may have the same composition or different compositions, the same conductivity type or different conductivity types, may have the same thickness or depth or have different thicknesses or depths, may include the same number of films or different numbers of films, may be formed the same formation technique or different formation techniques, or may be formed at substantially the same time or at different times.

Dual processing embodiments, such as the embodiment previously described and illustrated in FIG. 9, may allow one or more processing operations to be performed simultaneously, and thus, increase equipment throughput. The same type of different types of semiconductor devices may be formed along the opposite sides of the substrate 102.

Figure 10:
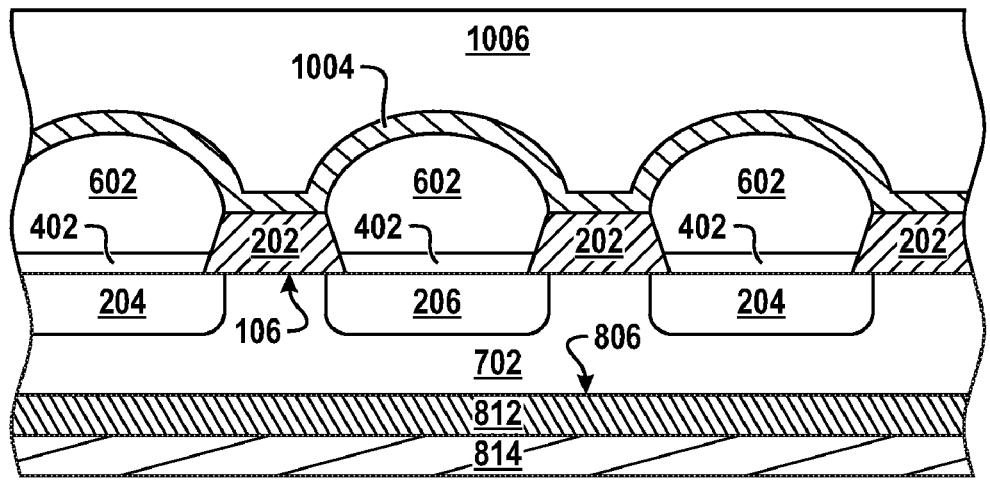
FIG. 10 includes an illustration of a cross-sectional view of the workpiece of FIG. 8 after forming a reflector in accordance with another embodiment.

In still another embodiment, a layer of material may be used to reflect light or other radiation at locations between the metallic regions 602. Referring to FIG. 10, a dielectric layer 1004 and a reflector 1006 are formed over the dielectric layer 202 and metallic regions 602. The dielectric layer 1004 can have a relatively high transmission to the targeted radiation, such as light, ultraviolet radiation, or a combination thereof. The dielectric layer 1004 can include an oxide, a nitride, or any combination thereof. The dielectric layer 1004 can be used to electrically insulate the metallic regions 602 from the reflector 1006 when the reflector 1006 includes a conductive material. In an embodiment, the dielectric layer 1004 can have a thickness of at least approximately 1 nm or at least approximately 100 nm, and in another embodiment, the dielectric layer 1004 can have a thickness no greater than approximately 1000 microns or no greater than approximately 1 microns.

The reflector 1006 can include a reflective material and can include silicon, silver, aluminum, nickel, another suitable material that can provide a mirror-like finish, or any combination thereof. The reflector 1006 can be formed using any of the techniques previously described with respect to the metal-containing layer 302 or the metallic regions 602. Because the reflector 1006 is principally used for reflection, its thickness can vary from very thin to very thick. In an embodiment, the reflector 1006 can have a thickness of at least approximately 2 nm or at least approximately 30 nm, and in another embodiment, the reflector 1006 can have a thickness no greater than approximately 2 mm or no greater than approximately 100 mm.

In another embodiment, the reflector 1006 can include an insulator, such as $TiO_2$, $Ta_2O_5$, another suitable material, or any combination thereof In this particular embodiment, the dielectric layer 1004 may not be needed and can be omitted.

The reflector 1006, and optional dielectric layer 1004, may be formed any time after the metallic regions 602 are formed. Thus, in a particular embodiment, the reflector 1006 may be formed before the separation is performed. In this embodiment, the reflector 1006 may have a thickness, such that it provides sufficient mechanical support to the subsequently formed semiconductor layer 702. A separation-enhancing species can be introduced into the substrate 102 during formation of the reflector 1006 instead or in addition to earlier processing. When the reflector 1006 is used and sufficiently thick, the thickness of the metallic regions 602 may not need to be as thick.

Figure 11:
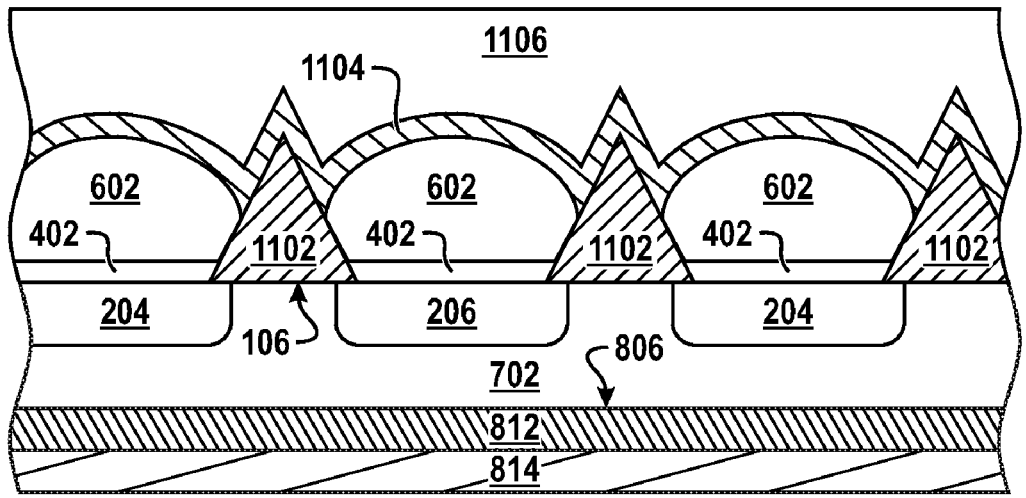
FIGS. 11 and 12 include illustrations of cross-sectional views of portions of workpieces in accordance with alternative embodiments.
Figure 12:
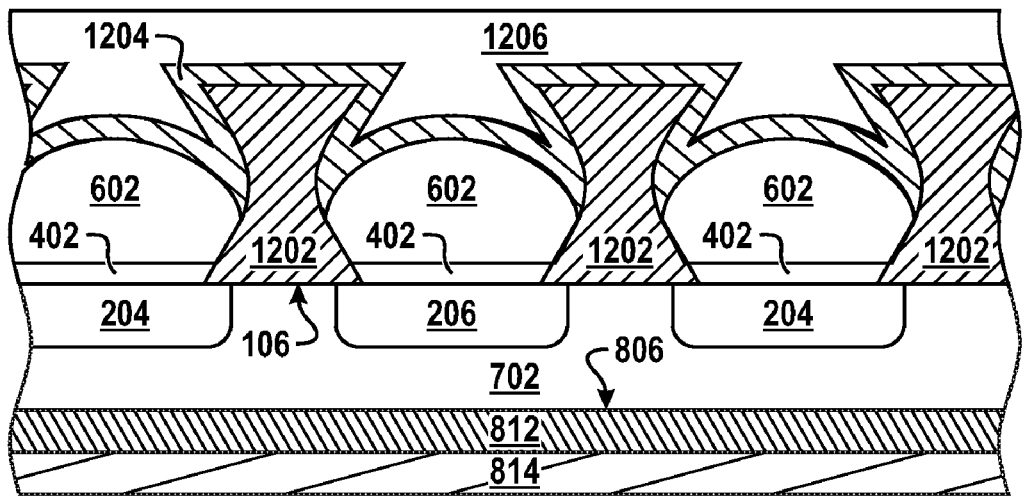

In another embodiment, a dielectric layer can be patterned to form angled dielectric regions, such as those illustrated in FIGS. 11 and 12. The angled regions act as Lambertian reflectors a metallic layer overlies the angled dielectric regions. The patterning may be performed using a wet etch, a dry etch, or a combination thereof Also, the dielectric layer can include a plurality of films, a film with a varying composition (e.g., increasing or decreasing amount of phosphorus or other dopant within the film), or any combination thereof. The patterning may also occur by a reverse patterning technique as described with respect to FIG. 12.

FIG. 11 illustrates a semiconductor device in another embodiment wherein the dielectric layer 202 is replaced by a patterned dielectric layer 1102 having triangular shapes. Another dielectric layer 1104 and reflector 1106 are similar to the dielectric layer 1004 and reflector 1006 as described with respect to FIG. 10. In this particular embodiment, the dielectric layers 1102 and 1104 can be substantially transparent to the radiation designed to be received by or emitted from the semiconductor device. The reflector 1106 can have a mirror-like finish. Thus, the combination of the patterned dielectric layer 1102 and reflector 1106 to form a Lambertian reflector. In another embodiment (not illustrated), the dielectric layer may be replaced with a conductive oxide to get the proper refractive properties of the oxide and the conductive properties of an interconnect. In this particular embodiment, only a single doped region or no doped region may lie along the primary side 106 of the semiconductor layer 702.

FIG. 12 illustrates a semiconductor device that has a different a Lambertian reflector. As compared to FIG. 11, the patterned dielectric layer 1202 has features with wider widths as distance from the semiconductor layer 702 increases. A reverse patterning technique may be used to achieve the shapes as illustrated in FIG. 12. A patterned sacrificial layer (not illustrated) formed at locations between the features of the subsequently-formed patterned dielectric layer 1202 will lie. After forming the patterned dielectric layer 1202, the patterned sacrificial layer is removed. The patterned sacrificial layer can formed with a single feature or a combination of features (e.g., cross-sectional rectangular shapes with sidewall spacers). Other techniques can be used to form the patterned dielectric layer 1202.

Another dielectric layer 1204 and reflector 1206 are similar to the dielectric layer 1004 and reflector 1006 as described with respect to FIG. 10. In this particular embodiment, the dielectric layers 1202 and 1204 can be substantially transparent to the radiation designed to be received by or emitted from the semiconductor device. The reflector 1206 can have a mirror-like finish. Thus, the combination of the patterned dielectric layer 1202 and reflector 1206 to form a Lambertian reflector. In another embodiment (not illustrated), a single doped region or no doped region may be formed along the primary side 106 of the semiconductor layer 702. In this particular embodiment, a metal-containing layer, such as a seed layer may be patterned to have features with shapes similar to the features of the patterned dielectric layer 1202.

In another embodiment, the reshaping operation as described with respect to FIG. 5 may be performed earlier in the process. Referring to FIG. 2, the dielectric layer 202 can be formed from a single insulating film or a plurality of insulating films that are deposited over the workpiece. In a particular embodiment, the characteristics of the dielectric layer 202 may be different for points closer to the substrate 102 as compared to corresponding points further from the substrate 102. In an embodiment, the composition of the dielectric layer 202 may change during or between depositions when the dielectric layer includes a plurality of films. For example, an oxide film may be closer to the substrate 102, and a nitride film may be deposited over the oxide film. In another embodiment, a dopant, such as phosphorus, can be incorporated at an increasing concentration during a later part of the deposition.

In a further embodiment, the dielectric layer 202 may include boron, phosphorous, another suitable dopant or any combination thereof. When an anneal is performed to activate dopants within the doped regions 204 and 206, the dielectric layer 202 may be reflowed to round the upper corners of the dielectric layer 202. In still another embodiment, the stress within the dielectric layer 202 can be changed by changing deposition parameters (e.g., radio frequency power, pressure, etc.) even though the composition is substantially the same throughout the thickness of the dielectric layer 202. In further embodiments, combinations of the foregoing may be used. When etching is performed to form the openings through the dielectric layer 202, etching can be performed such that isotropic etching is used for etching a portion of the dielectric layer 202, alternative etching the insulating material and etching a sidewall etch of the overlying mask, etching the insulating material and etching a sidewall etch of the overlying mask, taking advantage of a differential composition (doped oxide etches faster than undoped oxide), patterning followed by a sidewall spacer, another suitable technique, or any combination thereof. Many of the techniques described in shaping the dielectric layer 202 may be used in forming the patterned layers for the Lambertian reflectors in FIGS. 11 and 12.

Figure 13:
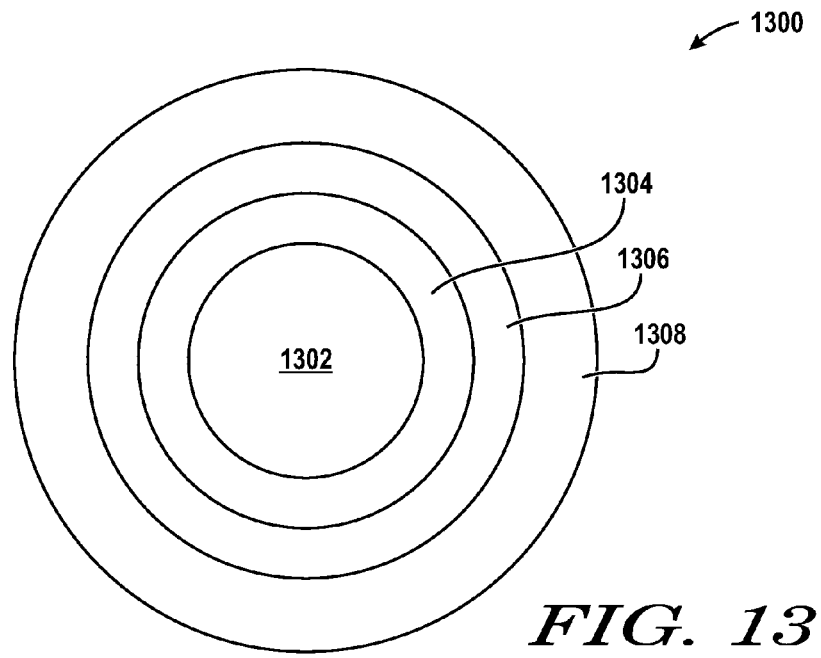
FIG. 13 includes an illustration of a cross-sectional view of a portion of a workpiece comprising a substrate, in ingot form, a doped region, and a conductive layer.

Embodiments previously described may use substrates that are in a wafer form. In another embodiment, the substrate may be in an ingot form. In a particular embodiment as illustrated in FIG. 13, the substrate 1302 can be substantially cylindrical. Such a substrate can be made from a boule grown using a Czochralski growth technique and machined to the desired shape. The ingot can have a diameter of approximately 50 mm to approximately 300 mm or even larger. The length of the ingot can be greater than the diameter and can range from approximately 150 mm to approximately 5 meters. The substrate 1302 can include any of the materials are previously described with respect to the substrate 102. The workpiece 1300 further includes a doped region 1304, a metal-containing region 1306, and a metallic region 1308, which can includes any of the materials, have any of the thicknesses, and be formed using any of the techniques as previously described with respect to the doped regions 204, the metal-containing regions 402, and the metallic regions 602, respectively, as previously described. A separation-enhancing species (not illustrated) can be introduced into the workpiece during an ion implantation operation, during formation of the metallic regions 602, or both. After reading this specification, skilled artisans will appreciate that one or more of the regions or films of the workpiece 1300 are not required and may not be used, and that other regions or films as previously described but are not illustrated may be used.

Figure 14:
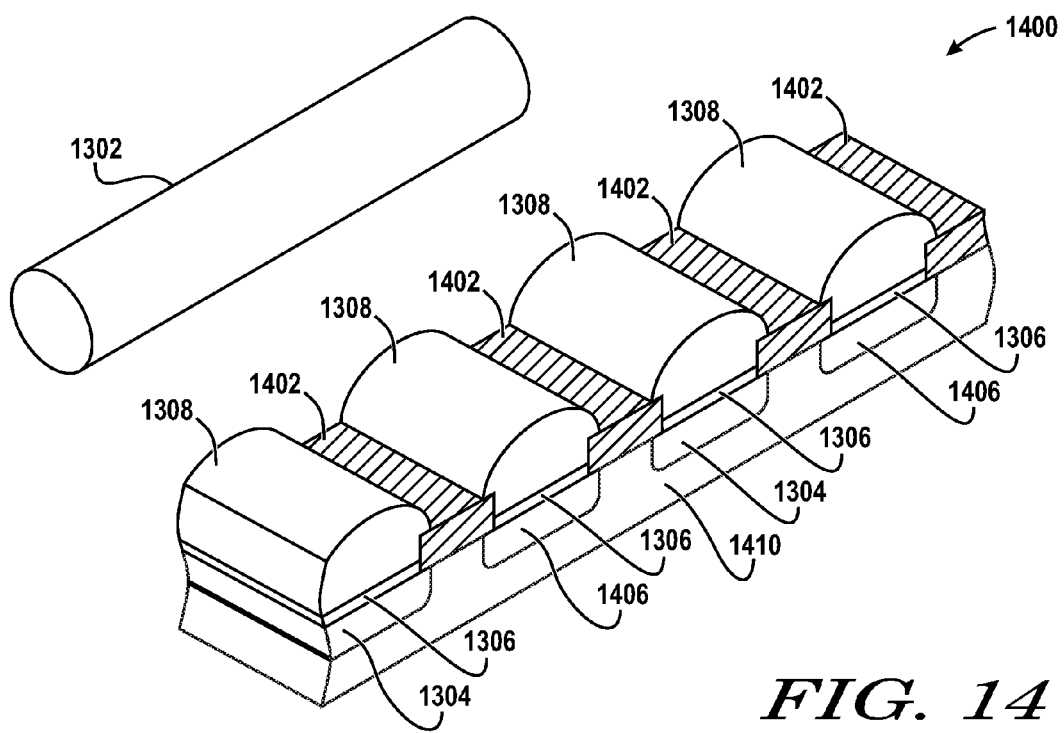
FIG. 14 includes an illustration of a cross-sectional view of the workpiece of FIG. 13 after a combination of a semiconductor layer, the doped region, the conductive layer has been separated from the substrate.

The conductive film 1308 can be scored, perforated, or cut to provide a weakened location from which separation can more readily start. The workpiece 1300 is then annealed using annealing conditions as previously described. During heating or cooling after the anneal, stress can build within the substrate 1302 and help to separate the combination of the conductive film 1308, the metal-containing film 1306, the doped region 1304, and a semiconductor layer 1410, which is a separated portion of the substrate 1302, from a remaining portion of the substrate 1302, as illustrated in FIG. 14. The embodiment of FIG. 14 also illustrates a patterned dielectric layer 1402 and doped regions 1406, which can includes any of the materials, have any of the thicknesses, and be formed using any of the techniques as previously described with respect to the dielectric layer 202, the doped regions 206, respectively, as previously described. The resultant workpiece 1400 can be further processed to form a semiconductor device. In this particular embodiment, the semiconductor device can be in the form of a rectangular sheet, as opposed to a circular disk. In still another embodiment, the substrates may be substantially rectangular and be formed using an edge-defined growth technique.

The embodiments described herein can be used to forming contacts on one side of a substrate while using separation technique to be performed. In a particular embodiment, a separation-enhancing species to be introduced into a substrate to allow more readily the separation of a surface layer of semiconductor material to be removed from the substrate. A mechanical operation may not need to be performed for the separation, or if a mechanical operation is used, such mechanical operation would not need to be as aggressive or damaging as compared to a mechanical tearing operation performed in the absence of the separation-enhancing species. Further, the doped regions and contacts can be formed along a side opposite where light or other radiation would be received by an electronic device. Thus, the efficiency is improved as contacts, interconnects, and the like are not formed along the radiation receiving surface of the electronic device.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method can include forming a first junction in the semiconductor substrate, and forming a region of hydrogen in the semiconductor substrate. The method can also include forming a dielectric layer over a first side of a semiconductor substrate, and patterning the dielectric layer to form a patterned dielectric layer defines an opening. The method can further include forming a first metallic layer over the patterned dielectric layer and within the opening, and annealing the first metallic layer to form a silicide layer. The method can still further include forming a second metallic layer over the silicide layer, wherein the second metallic layer is formed using an electrochemical process, and separating a combination of the first metallic layer, the second metallic layer, and a semiconductor layer by a process of anneal and strain induced by the second metallic layer.

In an embodiment of the first aspect, the method further includes moving the hydrogen from the second metallic layer into the semiconductor substrate, wherein moving the hydrogen from the second metallic layer into the semiconductor substrate is used to weaken regions of the semiconductor substrate to aid in separating the semiconductor layer from the semiconductor substrate. In another embodiment, the region of hydrogen in the semiconductor is formed by implantation. In still another embodiment, forming a region of hydrogen in the semiconductor substrate includes forming a first region of hydrogen to a first depth in the semiconductor substrate, and forming a second region of hydrogen to a second depth in the semiconductor substrate, wherein the first depth is different from the second depth. In a particular embodiment, each of the acute angles is no greater than approximately 75°. In another particular embodiment, the method further includes forming a third metallic layer on the dielectric regions to act as reflectors of light. In a further particular embodiment, the method further includes forming an insulating layer over the second metallic layer; and forming a third metallic layer over the insulating layer, wherein the third metallic layer reflects light at locations between conductive members within the second metallic layer.

In a further embodiment of the first aspect, the first metallic layer is formed by physical vapor deposition, atomic layer deposition, chemical vapor deposition, or any combination thereof. In still a further embodiment, the second metallic layer includes titanium, tungsten, palladium, copper, tin, nickel, or any combination thereof. In still a further embodiment, the forming the metallic layer further includes mechanically applying a metallic paste over the semiconductor substrate. In yet a further embodiment, the semiconductor substrate includes silicon, germanium, gallium arsenide, gallium nitride, indium phosphide, or any combination thereof.

In another embodiment of the first aspect, the semiconductor device is a photovoltaic cell or a light emitting device. In still another embodiment, the method further includes forming a second junction spaced apart from the first junction. In a particular embodiment, the silicide layer is formed at least partly from a semiconductor material within the first and second junctions. In a more particular embodiment, the first junction has a different polarity as compared to the second junction.

In a second aspect, a method of forming an electronic device can include forming a first patterned layer adjacent to a first side of a substrate including a semiconductor material. The method can also include separating a first semiconductor layer and the first patterned layer from the substrate, wherein the first semiconductor layer is a first portion of the substrate.

In an embodiment of the second aspect, the substrate is a substantially monocrystalline semiconductor substrate. In another embodiment, the substrate principally includes silicon, germanium, gallium arsenide, gallium nitride, indium phosphide, or any combination thereof. In still another embodiment, the method further includes introducing a first separation-enhancing species into the substrate at a first distance from the first side. In a particular embodiment, introducing separation-enhancing species includes implanting a separation-enhancing species at an energy corresponding to a projected range that is closer the first distance than to the first side. In a more particular embodiment, the projected range is substantially equal to the first distance. In another more particular embodiment, the separation-enhancing species includes hydrogen, helium, or boron.

In a further embodiment of the second aspect, the method further includes annealing the substrate and the first patterned layer. In still a further embodiment, the method further includes doping a first region adjacent to the first side of the substrate. In yet a further embodiment, forming the first patterned layer includes forming a patterned dielectric layer. In a particular embodiment, the method further includes doping a first region of the substrate adjacent to an opening within the patterned dielectric layer. In a more particular embodiment, the method further includes doping a second region of the substrate with a dopant having a conductivity type opposite that of the first portion, wherein the first and second regions lie along the first side of the substrate and are spaced apart from each other.

In another particular embodiment of the second aspect, the method further includes forming a first metallic layer within openings within the patterned dielectric layer. In a more particular embodiment, the method further includes reacting a portion of the first metallic layer with a semiconductor material within the substrate to form a metal-silicide compound and removing an unreacted portion of the first metallic layer. In still another particular embodiment, forming the patterned dielectric layer includes forming a dielectric region having a sidewall and a bottom, wherein the sidewall and bottom define an acute angle. In a more particular embodiment, the acute angle is no greater than approximately 75°. In another particular embodiment, the method further includes forming a metallic member partly formed on the sidewall of the dielectric region.

In another embodiment of the second aspect, forming the first patterned layer includes forming a patterned metal layer. In a particular embodiment, forming the patterned metal layer includes forming a first metallic member adjacent to the first side and electrically connected to a first doped region within the substrate. In a more particular embodiment, forming the patterned metal layer includes forming a second metallic member adjacent to the first side and electrically connected to a second doped region within the substrate, wherein the first and second doped regions have opposite conductive types and are spaced apart from each other.

In another particular embodiment of the second aspect, the method further includes introducing a first separation-enhancing species into the substrate at a first distance from the first side during or after forming the patterned metal layer. In a more particular embodiment, the first patterned metal layer includes titanium, tungsten, palladium, copper, tin, nickel, or any combination thereof. In another more particular embodiment, the method further includes forming a metal-silicide member, wherein the forming the first patterned metal layer is performed after forming the metal-silicide member. In still another more particular embodiment, forming the first patterned metal layer further includes forming an adhesion film, a barrier film, a seed film, or any combination thereof.

In yet another more particular embodiment of the second aspect, forming the first patterned metal layer is performed using physical vapor deposition, atomic layer deposition, chemical vapor deposition, an electrochemical process, or any combination thereof In an even more particular embodiment, forming the first patterned metal layer is performed using a hydrogen-containing gas. In a further more particular embodiment, incorporating the first separation-enhancing species includes incorporating hydrogen into the first patterned metal layer; and moving the hydrogen from the first patterned metal layer into the substrate. In an even more particular embodiment, forming the first patterned metal layer is performed using an acidic solution as a source of hydrogen. In another more particular embodiment, forming the first patterned metal layer and incorporating hydrogen into the first patterned metal layer occur substantially simultaneously during a particular time period.

In a further embodiment of the second aspect, separating the first semiconductor layer and the first patterned layer from the substrate includes mechanically separating the first semiconductor layer and the first patterned layer from the substrate. In a particular embodiment, mechanically separating the first semiconductor layer and the first metallic layer from the substrate is performed using a wedge, a wire, or a saw, laser, or an acoustical device. In still a further embodiment, separating the first semiconductor layer and the first patterned layer from the substrate includes fracturing or cleaving the substrate at substantially the first distance from the first side of the substrate. In yet a further embodiment, after separating the first semiconductor layer and the first patterned layer from the substrate, the first patterned layer is thicker than the first semiconductor layer. In another embodiment, the method further includes attaching a support member to a combination of the substrate and the first patterned layer, wherein the support member is closer to the first side of the substrate as compared to an opposite side of the substrate. The method also includes removing the support member after separating the first semiconductor layer and the first patterned layer from the substrate.

In still another embodiment of the second aspect, the method further includes forming an antireflective layer adjacent to a second side of the first semiconductor layer, wherein the second side is opposite the first side. In a particular embodiment, the antireflective layer is designed to have a reduced reflectance for a first wavelength less than 500 nm, and in another embodiment, the antireflective layer is designed to have an increased reflectance for a second wavelength greater than 700 nm. In a particular embodiment, the first wavelength is approximately a first multiple of a first particular wavelength in a range of 290 nm to 400 nm, and the second wavelength is approximately the first particular wavelength times a sum of a whole number plus 0.5.

In a further embodiment, the method further includes forming a reflector adjacent to a second side of the first semiconductor layer, wherein the second side is opposite the first side. In a particular embodiment, the reflector includes a Lambertian reflector. In yet a further embodiment, the electronic device includes a photovoltaic cell that includes the first semiconductor layer and the first metallic layer, a light emitting device that includes the first semiconductor layer and the first metallic layer, a radiation detector that includes the first semiconductor layer and the first metallic layer, or any combination thereof.

In another embodiment of the second aspect, the method further includes forming a second patterned layer adjacent to a second side of the substrate and separating a second semiconductor layer and the second patterned layer from the substrate, wherein the second semiconductor layer is a second portion of the substrate. In a particular embodiment, forming the first patterned layer and forming a second patterned layer are performed substantially simultaneously during a first time period. In another particular embodiment, a combination of the first semiconductor layer and first patterned layer is of a first semiconductor device type, a combination of the second semiconductor layer and second patterned layer is of the first semiconductor device type, and a thickness of the first semiconductor layer is substantially the same as a thickness of the second semiconductor layer. In still another particular embodiment, a combination of the first semiconductor layer and first patterned layer is of a first semiconductor device type, a combination of the second semiconductor layer and second patterned layer is of a second semiconductor device type, a thickness of the first semiconductor layer is different from a thickness of the second semiconductor layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method comprising:
   forming a first junction in a semiconductor substrate;
   forming a region of hydrogen in the semiconductor substrate;
   forming a dielectric layer over a first side of a semiconductor substrate;
   patterning the dielectric layer to form a patterned dielectric layer defines an opening;
   forming a first metallic layer over the patterned dielectric layer and within the opening;
   annealing the first metallic layer to form a silicide layer;
   forming a second metallic layer over the silicide layer, wherein the second metallic layer is formed using an electrochemical process;
   moving the hydrogen from the second metallic layer into the semiconductor substrate, wherein moving the hydrogen from the second metallic layer into the semiconductor substrate is used to weaken regions of the semiconductor substrate to aid in separating the semiconductor layer from the semiconductor substrate; and
   separating a combination of the first metallic layer, the second metallic layer, and a semiconductor layer by a process of anneal and strain induced by the second metallic layer.

2. The method of claim 1, wherein the region of hydrogen in the semiconductor is formed by implantation.

3. The method of claim 1, wherein forming a region of hydrogen in the semiconductor substrate comprises forming a first region of hydrogen to a first depth in the semiconductor substrate, and forming a second region of hydrogen to a second depth in the semiconductor substrate, wherein the first depth is different from the second depth.

4. The method of claim 3, further comprising forming a dielectric layer having a pair of sidewalls spaced apart from each other, wherein:
   a primary side of the substrate and each of the sidewalls define acute angles; and
   each of the acute angles is no greater than approximately 75°.

5. The method of claim 4, further comprising forming a third metallic layer on the dielectric layer to act as a reflector of light.

6. The method of claim 3, further comprising:
forming an insulating layer over the second metallic layer; and
forming a third metallic layer over the insulating layer, wherein the third metallic layer reflects light at locations between conductive members within the second metallic layer.

7. The method of claim 1, wherein the first metallic layer is formed by physical vapor deposition, atomic layer deposition, chemical vapor deposition, or any combination thereof.

8. The method of claim 1, wherein the second metallic layer comprises titanium, tungsten, palladium, copper, tin, nickel, or any combination thereof.

9. The method of claim 1, further comprising mechanically applying a metallic paste over the second metallic layer.

10. The method of claim 1, wherein the semiconductor substrate is gallium arsenide.

11. The method of claim 1, wherein the semiconductor substrate comprises silicon, germanium, gallium arsenide, gallium nitride, indium phosphide, or any combination thereof.

12. The method of claim 1, wherein the method forms a semiconductor device that is a photovoltaic cell.

13. The method of claim 1, wherein the method forms a semiconductor device that is a light emitting device.

14. The method of claim 1, wherein further comprising forming a second junction spaced apart from the first junction.

15. The method of claim 14, wherein the silicide layer is formed at least partly from a semiconductor material within the first and second junctions.

16. The method of claim 15, wherein the first junction has a different polarity as compared to the second junction.

* * * * *